United States Patent
Lee et al.

(10) Patent No.: US 6,538,266 B2
(45) Date of Patent: Mar. 25, 2003

(54) PROTECTION DEVICE WITH A SILICON-CONTROLLED RECTIFIER

(75) Inventors: Youn-Jung Lee, Sungnam (KR); Yong-Ha Song, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/864,660

(22) Filed: May 24, 2001

(65) Prior Publication Data

US 2002/0017654 A1 Feb. 14, 2002

(30) Foreign Application Priority Data

Aug. 11, 2000 (KR) ........................................ 2000-46681
Apr. 13, 2001 (KR) ........................................ 2001-19975

(51) Int. Cl.[7] ........................ H01L 29/74; H01L 31/111
(52) U.S. Cl. ........................ 257/173; 257/112; 257/129; 257/355; 257/356; 257/546
(58) Field of Search ............................ 257/173, 112, 257/120, 121, 129, 168, 355, 124, 126, 132, 133, 144, 152, 153, 154, 356, 546; 361/111

(56) References Cited

U.S. PATENT DOCUMENTS

| | | | |
|---|---|---|---|
| 4,400,711 A | 8/1983 | Avery | 357/43 |
| 4,484,244 A | 11/1984 | Avery | 361/56 |
| 4,633,283 A | 12/1986 | Avery | 357/23.13 |
| 4,939,616 A | 7/1990 | Rountre | 361/56 |
| 5,012,317 A | 4/1991 | Rountre | 357/38 |
| 5,072,273 A | 12/1991 | Avery | 357/38 |
| 5,140,401 A * | 8/1992 | Ker et al. | 257/43 |
| 5,343,053 A * | 8/1994 | Avery | 257/173 |
| 5,400,202 A * | 3/1995 | Metz et al. | 361/56 |
| 5,438,005 A | 8/1995 | Jang | 437/34 |
| 5,455,436 A * | 10/1995 | Cheng | 257/356 |
| 5,473,169 A * | 12/1995 | Ker et al. | 257/173 |
| 5,576,557 A * | 11/1996 | Ker et al. | 257/173 |
| 5,591,992 A * | 1/1997 | Leach | 257/173 |
| 5,721,445 A * | 2/1998 | Singh et al. | 257/369 |
| 5,734,541 A * | 3/1998 | Iniewski et al. | 361/111 |
| 5,754,381 A * | 5/1998 | Ker | 361/56 |
| 5,872,379 A * | 2/1999 | Lee | 257/355 |
| 5,898,205 A | 4/1999 | Lee | 257/355 |
| 5,949,634 A * | 9/1999 | Yu | 361/111 |
| 5,959,820 A * | 9/1999 | Ker et al. | 361/111 |
| 5,962,876 A * | 10/1999 | Yu | 257/133 |
| 5,982,601 A * | 11/1999 | Lin | 257/355 |
| 6,008,684 A * | 12/1999 | Ker et al. | 327/428 |
| 6,016,002 A * | 1/2000 | Chen et al. | 257/355 |
| 6,066,879 A * | 5/2000 | Lee et al. | 257/355 |
| 6,147,369 A * | 11/2000 | Chen et al. | 257/173 |
| 6,281,527 B1 * | 8/2001 | Chen | 257/168 |
| 2001/0019138 A1 | 9/2001 | Czech et al. | |
| 2002/0079538 A1 * | 6/2002 | Su et al. | 257/355 |

FOREIGN PATENT DOCUMENTS

| | | | | |
|---|---|---|---|---|
| EP | 0 982 776 A2 | 8/1999 | ........... | H01L/27/02 |
| EP | 1 128 442 A2 | 10/2000 | ........... | H01L/29/74 |

* cited by examiner

*Primary Examiner*—David Nelms
*Assistant Examiner*—Andy Huynh
(74) *Attorney, Agent, or Firm*—Mills & Onello, LLP

(57) ABSTRACT

A semiconductor device for lowering a triggering voltage includes a semiconductor substrate with a first conductivity; a semiconductor region formed in the substrate having a second conductivity; a first region formed in the substrate, having the first conductivity and being apart from the semiconductor region; a second region formed in the substrate having the second conductivity and being spaced apart from the semiconductor region and first region; a third region formed in the substrate, having the second conductivity and being spaced apart from the semiconductor region, the first and second regions; a fourth region formed in the semiconductor region, having the second conductivity and being connected to the third region through a conductive material; a fifth region formed in the semiconductor region, having the first conductivity and being spaced apart from the fourth region; and a sixth region formed in the semiconductor region, having the second conductivity and being spaced apart from the fourth and fifth regions.

25 Claims, 9 Drawing Sheets

PROTECTION DEVICE WITH A SILICON-CONTROLLED RECTIFIER

FIELD OF THE INVENTION

The invention is in the field of semiconductor devices and more particularly of protection devices incorporated on integrated circuits. The protection devices are used in protecting the electronic apparatuses from voltage and current transients, for example constructed of a silicon-controlled rectifier.

BACKGROUND OF THE INVENTION

It is well known that integrated circuits manufactured by using CMOS (complementary metal-oxide-semiconductor) fabrication technology are readily influenced by electrostatic discharge (ESD) induced, for example, from contact with a human body. When ESD occurs, high voltage transient (or high current transient) flows into the integrated circuit chip and causes physical damages therein, for example in the form of destruction of a thin gate oxide layer, or causing shorting of channels.

A number of techniques have been developed for protecting semiconductor devices, including bipolar transistors, field effect devices, and integrated circuits, from damaging ESD Effects. Such protection techniques have commonly taken the form of diode or transistor circuits located at the input and output regions of the integrated circuit chip.

As one of the popular forms of protection devices, silicon-controlled rectifiers (SCRs) have been utilized in protecting integrated circuits. The lower triggering voltage of the SCR is advantageous in enhancing protection performance against electrical transient damage such as electrostatic discharge (ESD). Such SCR approaches are proposed in a number of references, e.g., U.S. Pat. Nos. 4,400,711, 4,484,244, 4,633,283, or 5,012,317. Referring to FIG. 1A, which illustrates a known structure of the low-voltage SCR (e.g., as disclosed in U.S. Pat. No. 5,012,317), when the voltage of the external pad becomes higher, the parasitic PNP bipolar transistor Q2 is turned on. The transistor Q2 provides holes to the substrate 1, and the base-to-emitter voltage of parasitic NPN bipolar transistor Q1 becomes higher due to an influx of the holes, and then the transistor Q1 becomes turned on. Next, the excessive ESD current is discharged through a SCR circuit formed of the resulting PNPN path such that electrons from Vss terminal 13 are injected to the N-type well 3 through the substrate 1. The NP junction formed of the N-type well 3 and the P-type substrate 1 is caused to be reverse-biased, and a breakdown voltage at the NP junction is regarded to a triggering voltage (or a threshold voltage) of the SCR.

As CMOS circuits continue to become more highly integrated, and therefore decrease in size, the SCR shown in FIG. 1A becomes less effective as a protection device. While the range of the triggering voltage is generally positioned from 25V to 70V, a substantial part appears at the higher level the range because triggering throughout the SCR occurs at least after the breakdown of the NP junction. Thus, as density increases, it is more likely for the circuit to become damaged by the transient before the SCR is activated, due to the high triggering voltage. The triggering voltage corresponding to the SCR of FIG. 1A, for example, would approach about 70V.

Lowering the triggering voltage of a SCR has been considered in the past, for example as disclosed in U.S. Pat. No. 4,939,616—Rountree, and U.S. Pat. No. 5,072,273—Avery. In the Rountree example, an N+ region is formed at the interface of the N-type well (e.g., 3 in FIG. 1A) and the substrate (e.g., 1 in FIG. 1A), so that a breakdown occurs at the N+ region, in order to lower the triggering voltage thereof. The example given in the Avery reference, as shown in FIG. 1B, pulls down the triggering voltage of the SCR by electrically binding the N+ region 7 and the P+ region 5, both formed in the substrate 1, in addition to the N+ region 12 (or a P+ region) formed over the N-type well 3 and substrate 1. Although these two examples are useful for confronting transient voltage or current between an input pad and ground, i.e., a positive transient, throughout the PNPN junction, they are not suitable for providing high-performance ESD protection against a negative transient occurring between an input pad and a power supply voltage terminal. Assuming that, in the condition of an ESD protection between an input signal terminal (e.g. input pad) and a voltage supply terminal (e.g. power supply voltage), the reference numerals 13 and 15 are each assigned to the input pad and the power supply voltage respectively, an NPNP junction for distributing the negative transient cannot be formed therethrough because the substrate 1 and the input pad 13 are forced to be in a short circuit with them.

SUMMARY OF THE INVENTION

Accordingly, the primary object of the invention is to provide a silicon-controlled rectifier having a reduced triggering voltage.

It is another object of the invention to provide a silicon-controlled rectifier having a reduced turn-on voltage so as to be consistent in operating with a low voltage therein.

It is another object of the invention to provide a silicon-controlled rectifier capable of protecting a voltage or current transient in a bi-directional discharging loop.

It is another object of the invention to provide a silicon-controlled rectifier adaptable to a CMOS fabrication process without additional mask steps, having a reduced triggering voltage.

In order to attain the above objects, according to an aspect of the present invention, a silicon-controlled rectifier of the invention includes: a semiconductor substrate having a first conductivity; a semiconductor region formed in the substrate, having a second conductivity; a first region formed in the substrate, having the first conductivity and being spaced apart from the semiconductor region; a second region formed in the substrate, having the second conductivity and being spaced apart from the semiconductor region and first region; a third region formed in the substrate, having the second conductivity and being spaced apart from the semiconductor region, the first and second regions; a fourth region formed in the semiconductor region, having the second conductivity and being connected to the third region through a conductive material; a fifth region formed in the semiconductor region, having the first conductivity and being spaced apart from the fourth region; and a sixth region formed in the semiconductor region, having the second conductivity and being spaced apart from the fourth and fifth regions. The first and second regions are connected to a first terminal, and the fifth and sixth regions are connected to a second terminal. A gate layer formed to be laid over a surface between the second and third regions and connected to the first terminal.

In the case of that the third and fourth regions have the first conductivity, the fourth region being also connected to the third region through a conductive material, the first and second regions are connected to the first and second terminals, respectively, and the fifth and sixth regions are connected to a third terminal. The gate layer, provided over the surface between the second and the third regions and connected to the first terminal in the above case, is replaced a gate layer which is provided over a surface between the fourth and fifth regions and connected to the third terminal.

In another aspect of the invention, a silicon-controlled rectifier includes: a semiconductor substrate having a first conductivity; a semiconductor region having a second conductivity; a first region formed in the substrate, having the first conductivity; a second region formed in the substrate, having the second conductivity; a third region formed in the semiconductor region, having the second conductivity and being spaced apart from by a predetermined distance from a boundary between the substrate and semiconductor region; a fourth region formed in the semiconductor region, having the first conductivity; a fifth region formed in the semiconductor region, having the second conductivity; and a sixth region formed in the substrate, the sixth region having the first conductivity and being spaced apart by a predetermined distance from the boundary between the substrate and semiconductor region.

When a positive transient inflows thereto, the first and second regions are connected to a first terminal, and the fourth and fifth regions are connected to a second terminal. When a negative transient inflows thereto, the first and second regions are connected to the first and second terminals, respectively, and the fourth and fifth regions are connected to the third terminal.

The present invention further provides bi-directional discharging paths for the ESD protection. For this purpose, a silicon-controlled rectifier includes: a semiconductor substrate having a first conductivity; a first well formed in the substrate, having a second conductivity; a first region formed in the first well, having the first conductivity; a second region formed in the first well, having the second conductivity and connected to a first terminal together with the first region; a second well formed in the substrate, being spaced apart from the first well; a third region formed in the second well, having the second conductivity; a fourth region formed in the second well, having the first conductivity and being connected to a second terminal together with the third region.

For the purpose of lowering the triggering voltage of the bi-directional discharging SCR, the silicon controlled rectifier further includes: a fifth region formed in the first well, having the second conductivity and being spaced apart from, or adjacent to a boundary between the substrate and the first well by a predetermined distance; and a sixth region formed in the second well, having the second conductivity and being spaced apart from a boundary between the substrate and the second well by a predetermined distance. The fifth and sixth regions may optionally be comprised of the first conductivity.

In another aspect, a silicon-controlled rectifier includes: a semiconductor substrate having a first conductivity; a first well formed in the substrate, having a second conductivity; a first region formed in the first well, having the first conductivity; a second region formed in the first well, having the second conductivity and connected to a power supply voltage together with the first region; a second well formed in the substrate, being spaced apart from, or adjacent to the first well; a third region formed in the second well, having the second conductivity; a fourth region formed in the second well, having the second conductivity and being connected to an input pad together with the third region; a fifth region extending over the first well and the substrate, having the second conductivity; and a sixth region extending over the second well and the substrate, having the second conductivity.

In yet another aspect for the bi-directional discharging path for the ESD protection, a silicon-controlled rectifier includes: a semiconductor substrate having a first conductivity; a first well formed in the substrate, having a second conductivity; a first region formed in the first well, having the first conductivity; a second region formed in the first well, having the second conductivity and connected to a first terminal together with the first region; a second well formed in the substrate, being spaced apart from the first well; a third region formed in the second well, having the second conductivity; a fourth region formed in the second well, having the first conductivity and being connected to a second terminal together with the third region; a fifth region formed in the first well, having the second conductivity and being spaced apart from a boundary between the substrate and the first well by a predetermined distance; a sixth region formed in the second well, having the second conductivity and being spaced apart from a boundary between the substrate and the second well by a predetermined distance; a seventh region formed in the substrate, having the first conductivity and being spaced apart from a boundary between the substrate and the first well by a predetermined distance; and a eighth region formed in the substrate, having the first conductivity and being spaced apart from a boundary between the substrate and the second well by a predetermined distance.

BRIEF DESCRIPTION OF THE DRAWINGS

The foregoing and other objects, features and advantageous of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

The following detailed description is of the best modes presently contemplated by the inventors for practicing the invention. It should be understood that the description of these preferred embodiments is merely illustrative and that they should not be taken in a limiting sense.

The practical embodiments of the invention propose several types of SCR structures that are available for ESD protection devices. All other modifications from those are possible to be implemented with variable arrangements within the scope of the invention.

Figure 2A:
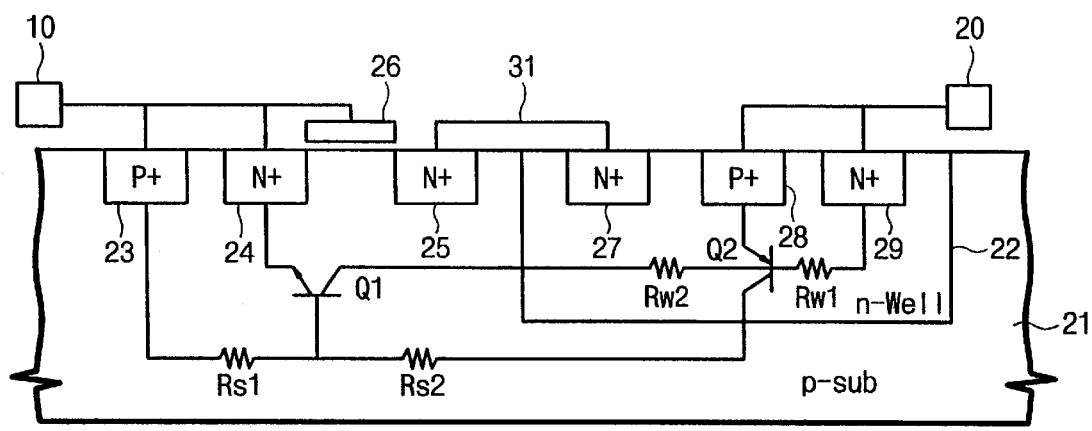
FIGS. 2A and 2B are sectional views of SCR configurations according to a first embodiment of the invention.
Figure 2B:
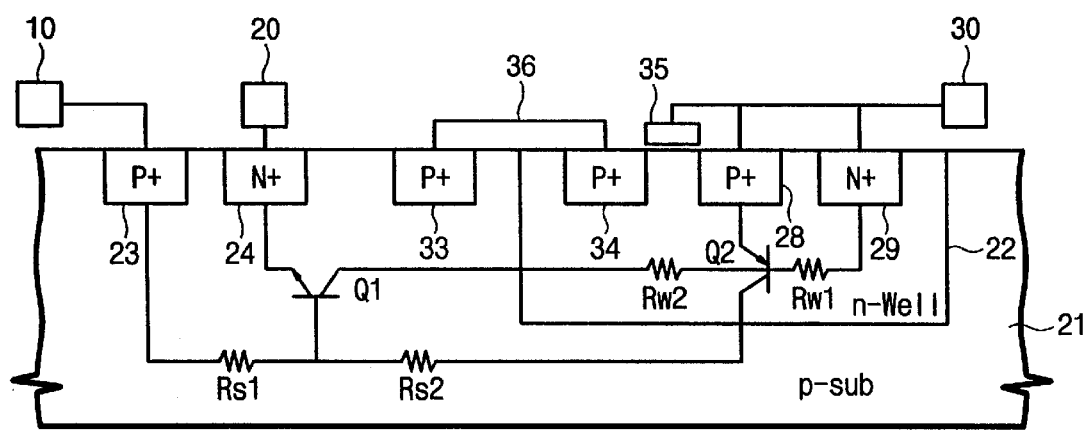

FIGS. 2A and 2B depict vertical structures implemented according to a first embodiment of the present invention, having a triggering voltage on the order of under 30V. The structure of FIG. 2A is adapted for protection against a positive transient. Referring to FIG. 2A, an N-type well 22 is formed in a P-type substrate 21, and includes N+ (highly doped with N-type impurities) regions 27 and 29, and P+ (highly doped with P-type impurities) region 28. The P+ and N+ regions, 28 and 29 are connected to an external pad 20 through a conductive material such as a common metal. The external pad 20 may be an input pad or output pad, for example.

An N+ region 27 in the well 22 is electrically connected to N+ region 25 located outside the N-type well 22 and formed in the substrate 21, by a conductive material 31. The N+ region 25 forms an N-type MOS (metal-oxide-semiconductor) structure together with another N+ region 24 and gate layer 26. The N+ region 24 is formed in the substrate 21 and electrically connected to a VSS (a substrate voltage or ground voltage) pad 10 together with the gate layer 26 and a P+ region 23 that is also formed in the substrate 21.

With the structure shown in FIG. 2A, it can be possible to provide an equivalent circuit model in which the N-type well 22, the P+ region 28 and substrate 21 operate as a base, emitter and collector respectively, of a PNP bipolar transistor Q2, while substrate 21, the N+ region 24 and N-type well 22 operate as a base, emitter and collector of an NPN bipolar transistor Q1. Therefore, a PNPN junction representing a discharging path for flowing out a positive transient is provided from the external pad 20 to the Vss pad 10 which is formed of P+ region 28/N-type well 22/P-type substrate 21/N+ region 24. Reference Rs1 represents a parasitic resistance in the substrate 21, between the substrate 21 and the P+ region 23, while Rs2 represents parasitic resistance in the substrate 21, between the substrate 21 and the N-type well 22. Reference Rw1 represents parasitic resistance in the N-type well, between the N+ region 29 and N-type well 22, while Rw2 represents parasitic resistance in the N-type well 22, between the N-type well 22 and substrate 21.

The N+ region 25 is further operable as the collector of the NPN bipolar transistor Q2. Thus, when positive transient is induced at the external pad 20, a PN junction formed of P+ region 28 and N-type well 22 becomes forward-biased, and an NP junction formed of N-type well 22 and substrate 21 becomes reverse-biased. At this time, a breakdown operation occurs at the PN junction formed of substrate 21 and N+ region 25 connected to N-type well 22 through N+ region 27. Since N+ region 25 is doped heavier than N-type well 22, a breakdown voltage at the junction where regeneration with EHPs (electron-hole pairs) occurs is lower than the case without N+ region 25. Lowering the breakdown voltage has the same effect as lowering of the triggering voltage of the SCR. Moreover, gate layer 26, provided over the channel between N+ regions 24 and 25, accelerates the speed of the breakdown process, contributing to the lowering of the triggering voltage.

The construction shown in FIG. 2B is similarly modified so as to protect an integrated circuit from high negative transient. Instead of N+ regions 25 and 27, P+ regions 33 and 34 are formed each in the substrate 21 and N-type well 22. The two P+ regions 33 and 34 are electrically connected to each other through a conductive material such a metal, and the P+ region 34 forms a MOS structure of P-type together with the P+ region 28 and gate layer 35. The P+ region 23 formed in substrate 21 is electrically connected to VSS pad 10, and the N+ region 24, likewise formed in substrate 21, is electrically connected to external pad 20. P+ region 28, the N+ region 29, and gate layer 35 are electrically connected to VCC (power supply voltage) pad 30 in common. The feature of the equivalent transistor circuit with the structure of FIG. 2B is identical with that of FIG. 2A, except that the emitter and base of parasitic bipolar transistor Q2, are couple to VDD and VSS, respectively.

When negative transient is applied to the external pad 20, a NP junction formed by N+ region 24 and substrate 21 becomes forward-biased, and a PN junction formed of substrate 21 and N-type well 22 becomes reverse-biased. A breakdown occurs at a PN junction formed of N-type well 22 and P+ region 34 connected to substrate 21 through P+ region 33. Since P+ region 34 is doped heavier than substrate 21, a breakdown voltage at the junction (where regeneration with EHPs occurs) is lower than the case without P+ region 34, therefore lowering the triggering voltage of the SCR. Gate layer 35 provided over the channel between P+ regions 34 and 28, further accelerates the speed of the breakdown process, contributing to the lowering of the triggering voltage.

Figure 3A:
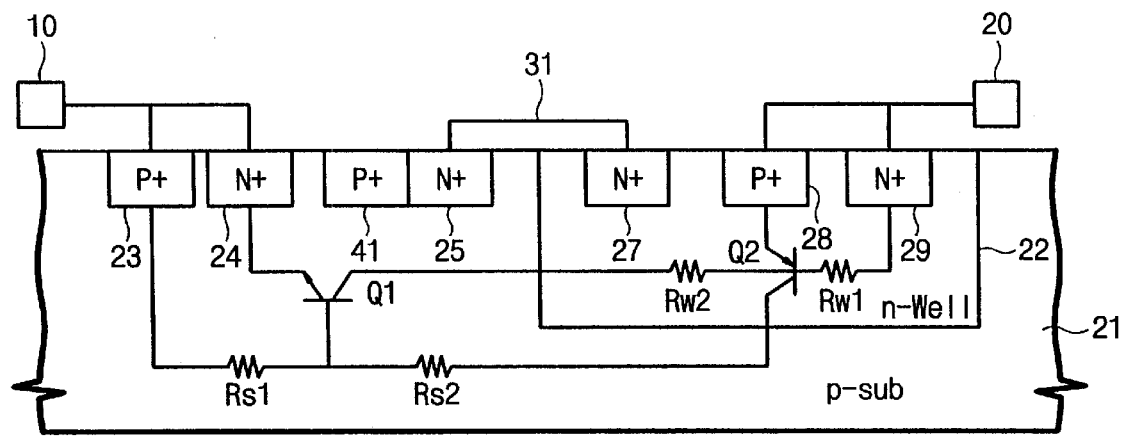
FIGS. 3A and 3B are sectional views of SCR configurations according to a second embodiment of the invention.
Figure 3B:
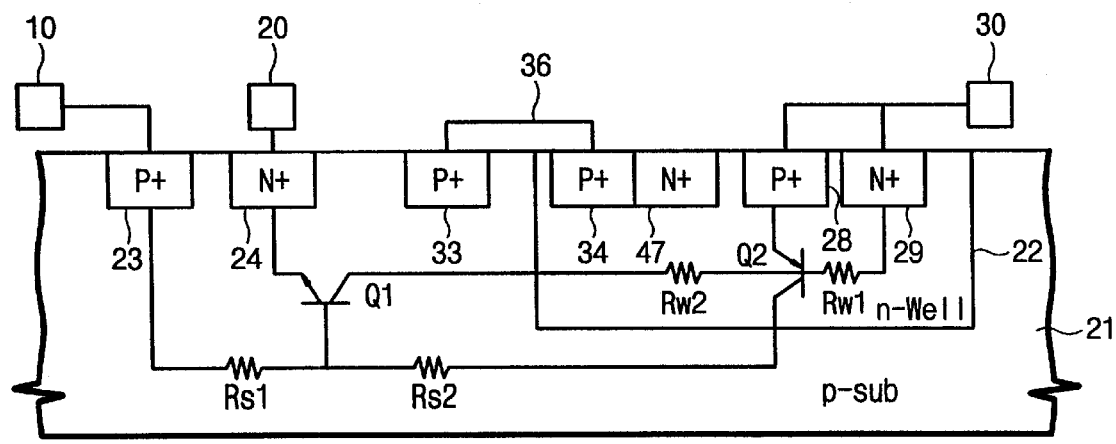

The structures shown in FIGS. 3A and 3B are modified versions of the configurations of FIGS. 2A and 2B. Referring to FIG. 3A, which shows an N-type SCR for protection against positive transient, P+ region 41 formed in substrate 21 is provided alongside, and in contact with, N+ region 25, likewise formed in the substrate 21, as described above, (referred to herein as a "butting" structure). N+ region 25 is electrically connected to N+ region 27 formed in the N-type well 22 through the conductive material 31. Other than the absence of gate layer 26, the FIG. 3A embodiment is similar in configuration to that of FIG. 2A. Therefore, a breakdown occurs at the PN junction between P+ region 41 and N+ region 25 electrically connected to N+ region 27 formed in N-type well 22.

The triggering voltage in the SCR of FIG. 3A may be lower than that of FIG. 2A, because the breakdown occurs at the PN junction formed of P+ region 41 and N+ region 25, in contact with each other, while the breakdown in FIG. 2A occurs between N+ region 25 and substrate 21.

FIG. 3B illustrates a P-type SCR that is the complementary structure of the N-type SCR of FIG. 3A, tailored for negative transient protection. P+ region 34 formed in the N-type well 22 is electrically connected to the P+ region 33 formed in the substrate 21 through the conductive material 36, and an additional N+ region 47 is provided in contact with the P+ region 34 in the N-type well 22. P+ region 23 formed in substrate 21 is connected into VSS pad 10, and N+ region 24 is connected to external pad 20.

When a negative transient flows into external pad 20, a breakdown occurs at a NP junction formed at the junction of N+ region 47 and P+ region 34, in contact with each other, as compared to the configuration of FIG. 2B where breakdown occurs between the P+ region 34 and N-type well 22. Therefore, the resulting triggering voltage level in the SCR of FIG. 3B may be lower than that of FIG. 2B.

Figure 1A:
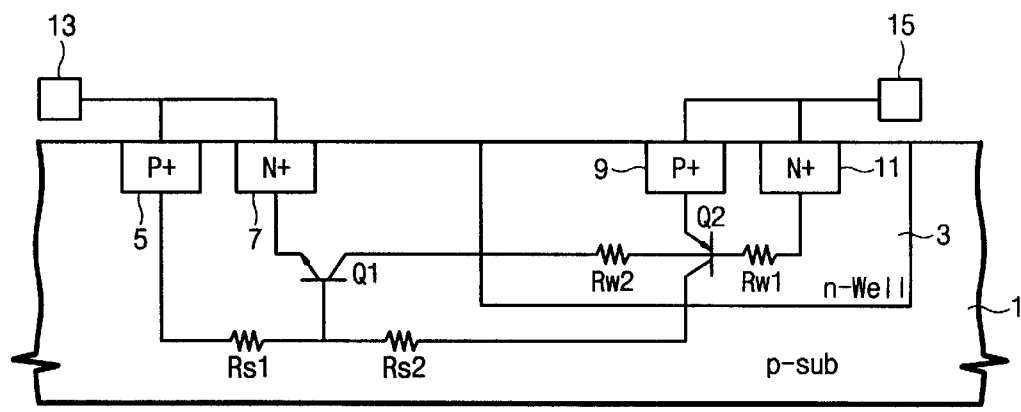
FIGS. 1A and 1B are sectional views of conventional silicon controlled rectifiers (SCRs) for ESD protection.
Figure 1B:
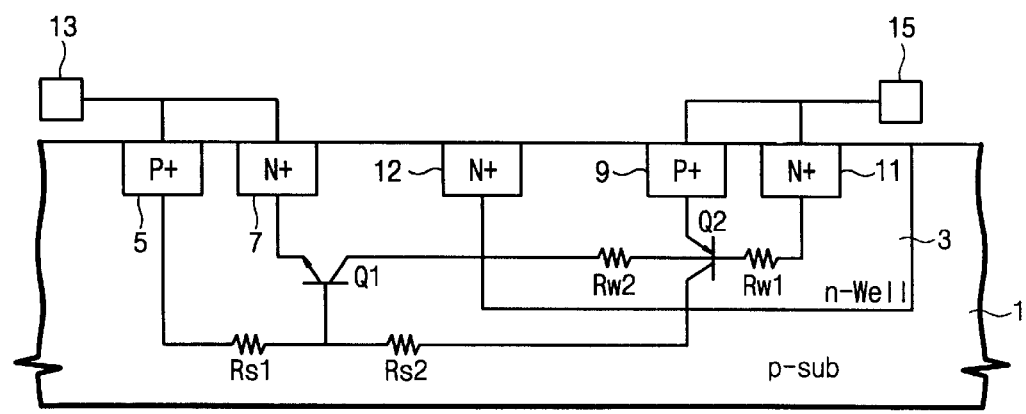
Figure 4A:
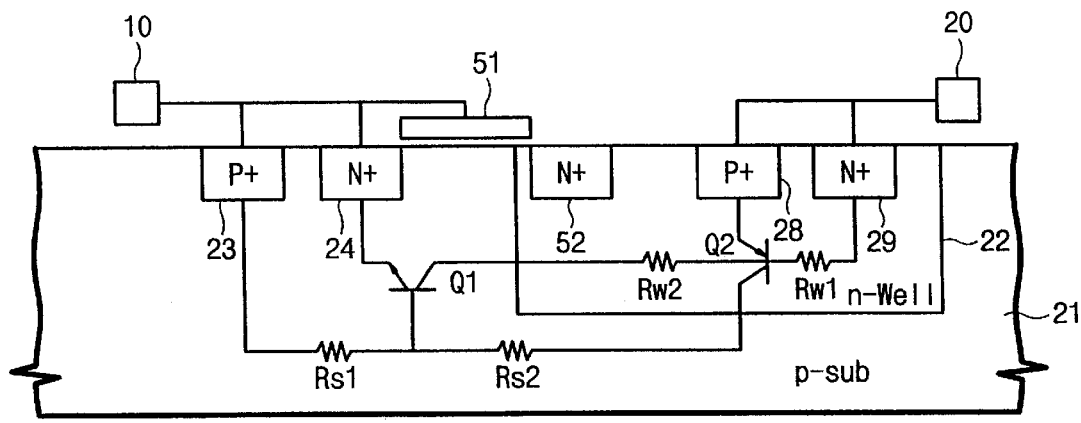
FIGS. 4A and 4B are sectional views of SCR configurations according to a third embodiment of the invention.
Figure 4B:
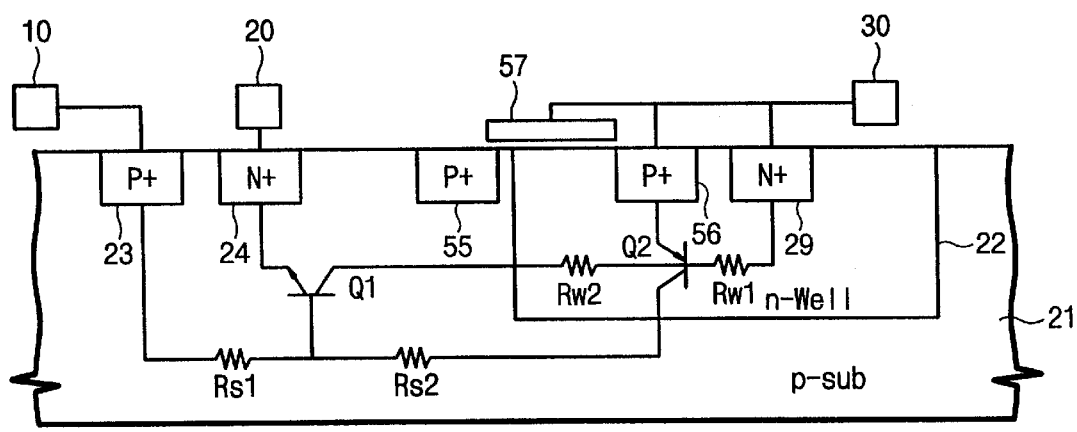

As a third embodiment, FIGS. 4A and 4B show additional architectures of the SCR that lead to a lower triggering voltage. Referring to FIG. 4A, corresponding to an SCR for protection against a positive transient, gate layer 51 is formed over the surfaces of substrate 21 and N-type well 22 and between N+ regions 24 and 52. The N+ region 52 is formed in the N-type well 22, positioned relatively close to the boundary between the N-type well 22 and substrate 21. Gate layer 51 is connected to VSS pad 10, together with P+ and N+ regions 23 and 24, while P+ and N+ regions 28 and 29, are connected to the external pad 20. There is no bias connection to N+ region 52. Gate layer 51 causes a breakdown at the junction between N-type well 22 (or N+ region 52) and substrate 21 to occur at a voltage lower than that of the conventional case (of FIG. 1).

Referring to the illustration of FIG. 4B, as a P-type SCR, configured to protect against a negative transient, gate layer 57 is formed over the surfaces of substrate 21 and N-type well 22 and between P+ regions 55 and 56. P+ region 55 is formed in substrate 21, relatively close to the boundary between the N-type well 22 and substrate 21. Gate layer 57 is connected to the VCC pad 30 together with P+ and N+ regions, 56 and 29. P+ region 23 is connected to VSS pad 10, and N+ region 24 is connected to external pad 20 to which the negative transient would be applied. There is no bias connection to P+ region 55. Similar in function to the gate layer 51 of the FIG. 4A configuration, gate layer 57 in FIG. 4B causes a breakdown at the junction between substrate 21 (or P+ region 55) and N-type well 22 to occur at a lower voltage than in the conventional case (of FIG. 1).

It can be noted that, the configurations of FIGS. 2B, 3B and 4B are proposed to protect an integrated circuit chip from a negative transient, P+ region 23 formed in substrate 21 is connected to VSS pad 10 and N+ region 24 is connected to external pad 20. This connection is for the purpose of preventing a short circuit between the substrate 21 and the external pad 20.

Figure 5A:
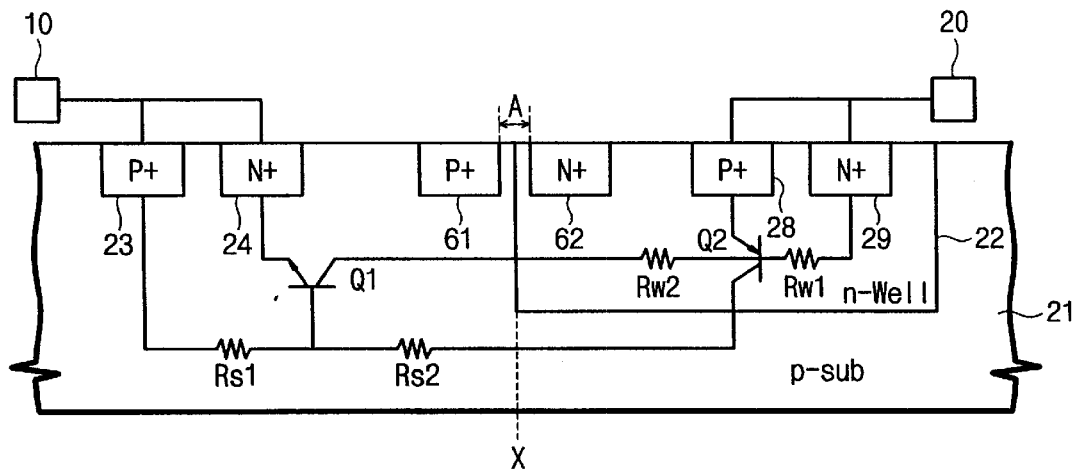
FIGS. 5A through 5C are sectional views of SCR configurations according to a fourth embodiment of the invention.
Figure 5B:
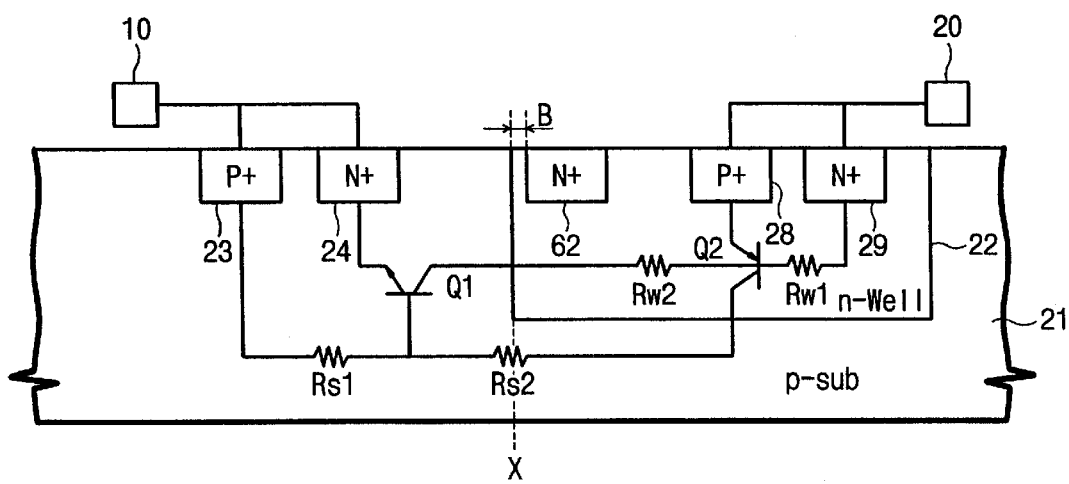
Figure 5C:
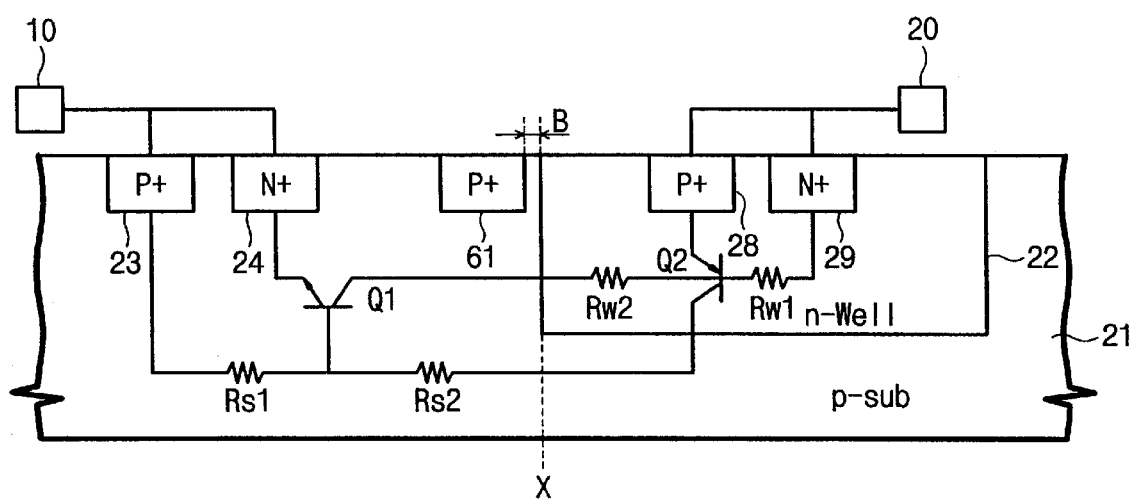

FIGS. 5A through 5C illustrate protective SCR structures according to a fourth embodiment of the present invention, accomplishing the lowering of the triggering voltage thereof by means of adjusting a distance between a well-substrate boundary and a N+ region or P+ region.

Referring to FIG. 5A, P+ region 61 and N+ region 62 are formed in the substrate 21 and N-type well 22, respectively, relatively proximal to, and on opposite sides of, the well-substrate boundary X. The distance A between the P+ and N+ regions, 61 and 62, becomes a parameter used to determine the resulting breakdown voltage at the PN junction therebetween, and is proper to be set in the range of 1~1.2 μm for accomplishing a triggering voltage under 30V. There is no bias connection to P+ region 61 and N+ region 62. P+ region 23 and N+ region 24, formed in substrate 21, are connected to VSS pad 10, while P+ region 28 and N+ region 29, formed in N-type well 22, are connected to external pad 20. A breakdown occurs at the reverse-biased junction formed between N+ region 62 and P+ region 61 when a positive transient is applied to external pad 20. Considering that a triggering voltage is variable a function of the distance A (the smaller the distance A is, the lower the triggering voltage is), the distance A could be adjusted to an optimal value for the purpose of accomplishing a low triggering voltage at least under 30V.

In FIGS. 5B and 5C, one of the N+ region 62 and P+ region 61 is formed in the N-type well 22 and substrate 21, respectively, being spaced apart from the well-substrate boundary X by distance B on the order of 0.5~0.6 μm (i.e. half of the distance A in FIG. 5A). When a positive transient flows into external pad 20, breakdown occurs at the junction between N+ region 62 and substrate 21 in FIG. 5B, and the junction between N-type well 22 and P+ region 61 in FIG. 5C, respectively.

Although, FIGS. 5A through 5C illustrate SCR structures for protection against a positive transient, it is possible to arrange those configurations into structural connections corresponding to protection against a negative transient by connecting P+ region 28 and N+ region 29 into VCC pad 30 in common, and by connecting P+ region 23 and N+ region 24 into VSS pad 10 and external pad 20, respectively, in the manner as shown FIGS. 2B, 3B, or 4B.

FIGS. 6A through 6E illustrate other various SCR structures that are symmetrical about vertical center line C, and having a bi-directional discharging loop in which ESD protection is available between the external pad 20 and VCC pad 30 as well as between the external pad 20 and VSS pad 10, accompanied by a lower triggering voltage thereof.

Figure 6A:
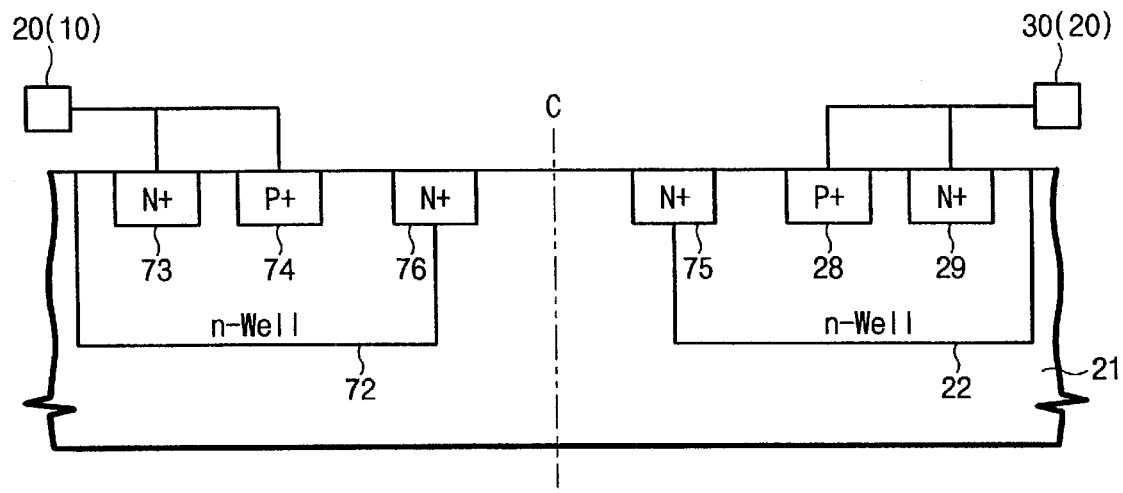
FIGS. 6A through 6E are sectional views of SCR configurations having a symmetrical structure for bi-directional ESD protection between an input pad and a power supply pad, and between an input pad and a ground, according to the invention.
Figure 6B:
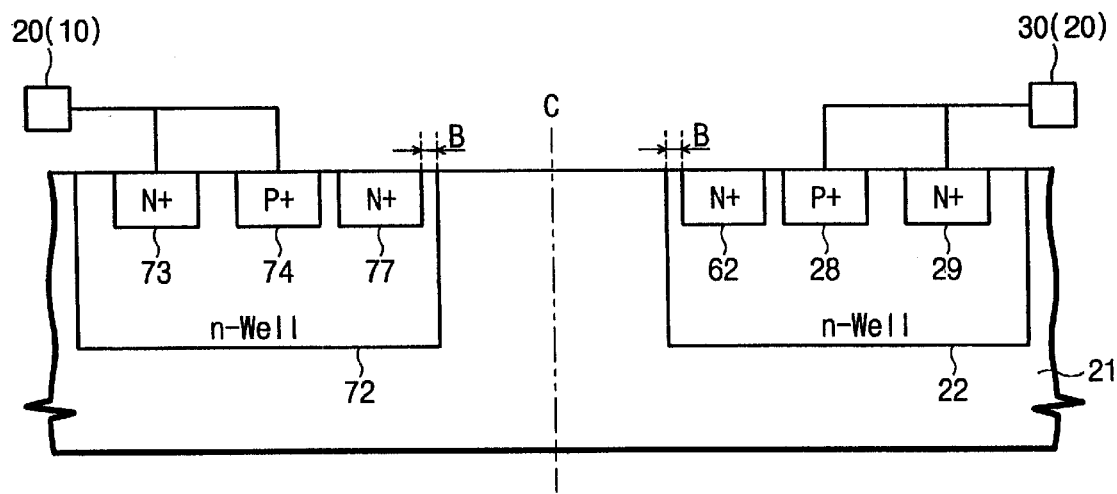

First, referring to FIGS. 6A and 6B, P+ and N+ regions, 28 and 29, are formed in N-type well 22 (or the first N-type well) and connected to VCC pad 30 (or external pad 20 in the case of the positive transient protection) in common. In addition to N-type well 22, another N-type well 72 (or the second N-type well) is formed in another area of substrate 21, being symmetrical with N-type well 22 with respect to the vertical centerline C. N+ and P+ regions, 73 and 74, are formed in N-type well 72 and connected to external pad 20 (VSS pad 10 in the case of the positive transient protection) in common. When the negative transient inflows thereto, a discharging path for dispersing a negative transient is provided from the external pad 20 to the VCC pad 30, which is formed of N+ region 73/n-Well 72/substrate 21/n-Well 22/P+ region 28. When the positive transient inflows thereto, a discharging path for dispersing a positive transient is provided from the external pad 20 to the VSS pad 10, which is formed of P+ region 28/n-Well 22/substrate21/n-Well 72/N+ region 73.

Figure 6C:
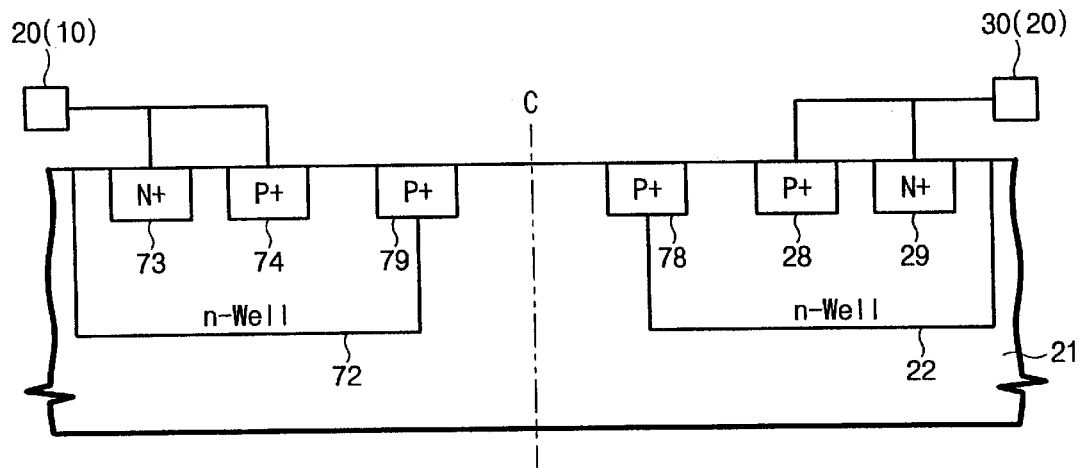

For the purpose of lowering the triggering voltage of the SCR, N+ region 75 is formed to extend across the boundary of substrate 21 and N-type well 22, and, symmetrically, N+ region 76 is formed to extend across the boundary of substrate 21 and N-type well 72. Since N-type well 72 isolates P+ region 74 from substrate 21, there is no formation of a short circuit between P+ region 74 and substrate 21 even when a negative transient inflows through external pad 20. As described above, It is possible to substitute the N+ regions, 75 and 76, with P+ regions, 78 and 79, as shown in FIG. 6C, in order to accomplish the lower triggering voltage.

Figure 6D:
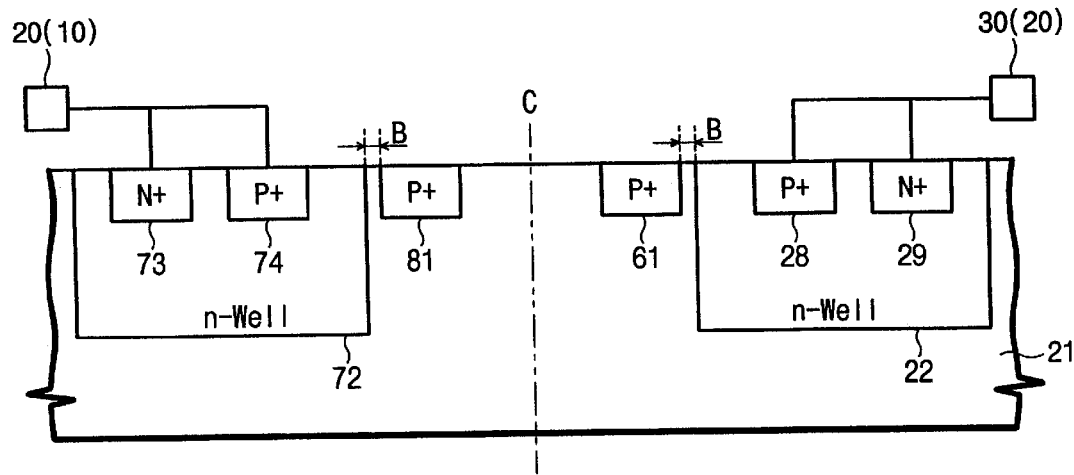
Figure 6E:
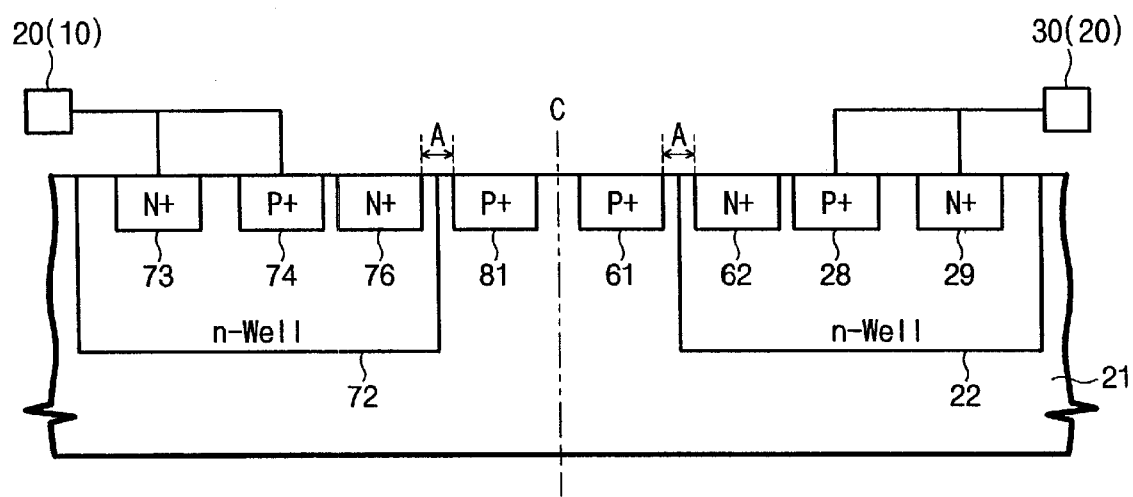

In FIG. 6B, N+ region 77 is formed in N-type well 72, spaced apart from the boundary between N-type well 72 and substrate 21 by the distance B as N+ region 62 formed in N-type well 22 is. It can be well seen that the structure in the N-type well (22 or 72) is similar to that shown in FIG. 5B, and the left and right sides are symmetrical from each other. FIG. 6D shows a symmetrical modification of FIG. 6B configuration, for the placement of the P+ region 61 with respect to the N+ well 22, as shown in FIG. 5C. P+ region 81 is formed in substrate 21, being spaced apart from the boundary between N-type well 72 and substrate 21 by the distance B. FIG. 6E is a symmetrical configuration combining the features of FIGS. 6B and 6D. In this configuration, N+ and P+ regions, 76 and 81, are formed in N-type well 72 and substrate 21, respectively, and are spaced apart from each other by the distance A. Similarly, N+ and P+ regions, 62 and 61, are formed in N-type well 22 and substrate 21, respectively, and are spaced apart from each other by the distance A. The placement of the N+ and P+ region 76, 81 and 62, 61 is symmetrical about the center line C.

As described above, the present invention provides advanced SCR structures that are capable of reducing the triggering voltage. It possible to provide for flexibility in adjusting the resulting triggering voltage (e.g., as shown in FIGS. 5A through 5C). Additionally, ESD protection can be accomplished in a bi-directional discharging path for both positive (e.g., between the external pad and the VSS pad) and negative (e.g., between the external pad and the VCC pad) transients. Furthermore, since the active regions and gate layers, being employed for lowering the triggering voltage of the SCR in FIGS. 2A through 6E, can be formed along with other conventional active regions by means of a standard CMOS manufacturing process, it is not necessary to prepare additional mask steps for constructing the aforementioned structures in order to lower the triggering voltage. While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor device comprising:
   a semiconductor substrate having a first conductivity;
   a semiconductor region formed in the substrate having a second conductivity;
   a first region formed in the substrate, having the first conductivity;
   a second region formed in the substrate, having the second conductivity;
   a third region formed in the semiconductor region, having the second conductivity and being spaced apart from a boundary between the substrate and the semiconductor region;
   a fourth region formed in the semiconductor region, having the first conductivity; and
   a fifth region formed in the semiconductor region, having the second conductivity;
   wherein the first region and the second region are connected to a first terminal, the fourth and the fifth regions are connected to a second terminal, and the third region is independent of the second terminal.

2. The semiconductor device of claim 1 further comprising a gate layer formed over a surface between the second region and the third region and connecting to the first terminal.

3. The semiconductor device of claim 1 further comprising a sixth region formed in the substrate, having the second conductivity and being spaced apart from the semiconductor region, the first region and the second region and being connected to the third region through a conductive material.

4. The semiconductor device of the claim 3, further comprising a gate layer formed over a surface between the second region and the sixth region and connected to the first terminal.

5. The semiconductor device of claim 3, further comprising a seventh region formed in the substrate, the seventh region having the first conductivity and being adjacent to the sixth region.

6. The semiconductor device of claim 1, further comprising a sixth region formed in the substrate, having the first conductivity and being spaced apart from the semiconductor region, the first region and the second region.

7. A semiconductor device comprising:
   a semiconductor substrate having a first conductivity;
   a semiconductor region formed in the substrate having a second conductivity;
   a first region formed in the substrate, having the first conductivity;
   a second region formed in the substrate, having the second conductivity;
   a third region formed in the substrate, having the first conductivity and being spaced apart from a boundary between the substrate and the semiconductor region;
   a fourth region formed in the semiconductor region, having the first conductivity; and
   a fifth region formed in the semiconductor region, having the second conductivity;
   wherein the first region is connected to a first external terminal, and the second region is connected to a second external terminal and the fourth region and the fifth region are connected to a third external terminal, the third external terminal being the exclusive external terminal of the semiconductor region.

8. The semiconductor device of claim 7, wherein the first terminal is connected to the second terminal.

9. The semiconductor device of claim 7 further comprising a gate layer formed over a surface between the third region and the fourth region and connected to the third terminal through a conductive material.

10. The semiconductor device of claim 7, further comprising a sixth region formed in the semiconductor region, having the first conductivity, and spaced apart from the boundary between the semiconductor region and the substrate, the fourth region and the fifth region and being connected to the third region.

11. The semiconductor device of claim 10 further comprising a gate layer formed over a surface between the sixth region and the fourth region and connected to the third terminal through a conductive material.

12. The semiconductor device of claim 10 further comprising a seventh region formed in the semiconductor region adjacent to the sixth region, having the second conductivity.

13. A semiconductor device comprising:
   a semiconductor substrate with a first conductivity;
   a first well formed in the substrate, having a second conductivity;
   a first region formed in the first well, having the first conductivity;
   a second region formed in the first well, having the second conductivity and connected to a first terminal together with the first region;
   a second well formed in the substrate, the second well being adjacent to and spaced apart from the first well, the second well having the second conductivity;
   a third region formed in the second well, having the second conductivity; and
   a fourth region formed in the second well, having the first conductivity and being connected to a second terminal together with the third region.

14. The semiconductor device of claim 13, wherein the first terminal is a voltage supply terminal and the second terminal is an I/O signal terminal.

15. The semiconductor device of claim 13, wherein the first terminal is a ground terminal and the second terminal is an I/O signal terminal.

16. The semiconductor device of claim 13, further comprising:
   a fifth region extending over the first well and the substrate; and
   a sixth region extending over the second well and the substrate, having a like conductivity with that of the fifth region.

17. The semiconductor device of claim 16, wherein the fifth and sixth regions have the first conductivity.

18. The semiconductor device of claim 16, wherein the fifth and sixth regions have the second conductivity.

19. A semiconductor device comprising:

a semiconductor substrate having a first conductivity;

a first well formed in the substrate, having a second conductivity;

a first region formed in the first well, having the first conductivity;

a second region formed in the first well, having the second conductivity and connected to a first terminal together with the first region;

a second well formed in the substrate, being spaced apart from the first well, having the second conductivity;

a third region formed in the second well, having the second conductivity;

a fourth region formed in the second well, having the first conductivity and being connected to a second terminal pad together with the third region;

a fifth region formed in the first well being spaced apart from a first boundary between the substrate and the first well by a predetermined distance, having the second conductivity; and a sixth region formed in the second well being spaced apart from a second boundary between the substrate and the second well by the predetermined distance, having the second conductivity.

20. The semiconductor device of claim 19, wherein the first terminal is a voltage supply terminal and the second terminal is an I/O signal terminal.

21. The semiconductor device of claim 19, wherein the first terminal is a ground terminal and the second terminal is an I/O signal terminal.

22. A semiconductor device comprising:

a semiconductor substrate having a first conductivity;

a first well formed in the substrate, having a second conductivity;

a first region formed in the first well, having the first conductivity;

a second region formed in the first well, having the second conductivity and connected to a first terminal together with the first region;

a second well formed in the substrate, being spaced apart from the first well, having the second conductivity;

a third region formed in the second well, having the second conductivity;

a fourth region formed in the second well, having the first conductivity and being connected to a second terminal together with the third region;

a fifth region formed in the substrate, having the first conductivity and being spaced apart from a first boundary between the substrate and the first well by a first predetermined distance; and a sixth region formed in the substrate, having the first conductivity and being spaced apart from a second boundary between the substrate and the second well by the first predetermined distance.

23. The semiconductor device of claim 22, further comprising:

a seventh region formed in the first well, having the second conductivity and being spaced apart from the first boundary between the substrate and the first well by a second predetermined distance; and an eighth region formed in the second well, having the second conductivity and being spaced apart from the second boundary between the substrate and the second well by the second predetermined distance.

24. The semiconductor device of claim 22, wherein the first terminal is a voltage supply terminal and the second terminal is an I/O signal terminal.

25. The semiconductor device of claim 22, wherein the first terminal is a ground terminal and the second terminal is an I/O signal terminal.

\* \* \* \* \*